United States Patent [19]

Tanaka et al.

[11] Patent Number: 4,460,718

[45] Date of Patent: Jul. 17, 1984

[54] EPOXY RESIN COMPOSITION

[75] Inventors: Isamu Tanaka; Hitoshi Oka; Akira Tomizawa, all of Yokohama; Hiroshi Kikuchi, Zushi, all of Japan

[73] Assignee: Hitachi, Ltd., Tokyo, Japan

[21] Appl. No.: 469,279

[22] Filed: Feb. 24, 1983

[30] Foreign Application Priority Data

Feb. 26, 1982 [JP] Japan .................................. 57-29007

[51] Int. Cl.$^3$ ...................... C08L 63/00; C08L 63/02; C08L 63/04; C08L 63/08
[52] U.S. Cl. .................................. 523/400; 523/420; 523/428; 523/443; 528/123; 528/407
[58] Field of Search ............... 523/400, 420, 428, 443; 528/123, 407

[56] References Cited

U.S. PATENT DOCUMENTS

| | | | |
|---|---|---|---|
| 2,992,193 | 7/1961 | Porret et al. | 528/407 |
| 3,210,379 | 10/1965 | Porret | 528/407 |
| 3,261,809 | 7/1966 | Sherr | 528/123 |
| 3,443,988 | 5/1969 | McCormack et al. | 428/209 |
| 3,631,149 | 12/1971 | Gempeler et al. | 528/123 |
| 3,732,286 | 5/1973 | Son et al. | 528/123 |
| 3,795,657 | 3/1974 | Howsam et al. | 528/407 |

FOREIGN PATENT DOCUMENTS

| | | | |
|---|---|---|---|
| 2024395 | 11/1970 | Fed. Rep. of Germany | 528/123 |
| 2649402 | 5/1978 | Fed. Rep. of Germany | 528/123 |
| 1037895 | 8/1966 | United Kingdom | 523/420 |

*Primary Examiner*—Ronald W. Griffin
*Attorney, Agent, or Firm*—Antonelli, Terry & Wands

[57] ABSTRACT

An epoxy resin composition comprising an epoxide compound, a guanidine compound, a filler, a thixotropic agent and an organic solvent and having a thixotropy index of 5 to 40 and a viscosity of 800 to 10,000 poises (at 20° C.) is suitable for forming a resist film which is used in electroless metal plating with excellent heat resistance, solder resistance and corrosion resistance, and the like.

14 Claims, No Drawings

EPOXY RESIN COMPOSITION

This invention relates to an epoxy resin composition, particularly an epoxy resin composition suitable for forming a resist film which is used in electroless metal plating.

The formation of a circuit pattern on a base board (or substrate) has heretofore been carried out, for example, by the following steps (I) to (III):

(I) A substrate is dipped in a Pd-Sn catalyst solution to absorb the catalyst on the whole surface of the substrate.

(II) A resist layer is formed on the surface of catalyst-absorbed substrate other than the portions on which a circuit pattern is to be formed.

(III) A circuit pattern is formed by immersion for a long time in a heated strongly alkaline electroless copper plating solution having a temperature of 60° to 80° C. and a pH of 12 to 13.

However, in the case of conventional resists, the formation of an electroless copper plating circuit pattern has been difficult partly because when immersed in a heated strongly alkaline electroless copper plating solution for a long time, the resists are attacked by the plating solution to decrease in adhesion to a base board.

Moreover, the resists have not been able to withstand heat applied when a circuit pattern formed thereby is subjected to soldering.

An object of this invention is to provide a resist composition for electroless metal plating which is in good order even when immersed in a heated strongly alkaline electroless metal plating solution for a long time, and can withstand heat applied when a circuit pattern formed thereby is subjected to soldering.

This invention provides an epoxy resin composition comprising (a) one or more epoxide compounds in an amount of 100 parts by weight, (b) one or more guanidine compounds in an amount of 0.5 to 2.0 equivalents per equivalent of the epoxide compound, (c) one or more fillers in an amount of 3 to 150 parts by weight, (d) a thixotropic agent (the added amount thereof being in such a range that the thixotropy index of the resulting composition comprising the components (a) to (e) is 5 to 40), and (e) an organic solvent (the added amount thereof being in such a range that the viscosity of the resulting composition is 800 to 10,000 poises).

When the amount of the guanidine compound as the component (b) is less than 0.5 equivalent, or more than 2.0 equivalents, the resulting resist layer is soft, and when immersed in a heated strongly alkaline electroless metal plating solution, it undergoes swelling, color change to white, cracking, dissolution and peeling-off due to decrease in the adhesion to the base board when immersed in a heated strongly alkaline electroless metal plating solution, and there take place blisters due to the heat applied when a circuit pattern formed by electroless plating is subjected to soldering.

When the amount of the filler as the component (c) is less than 3 parts by weight, or more than 150 parts by weight, the screen printability is lowered, and no flat resist layer can be obtained.

The thixotropic agent as the component (d) and the organic solvent as the component (e) permit successful printing when their amounts are in such a range that the physical properties described above are obtained. The thixotropy index is a value obtained by dividing the viscosity measured by use of a B type viscometer at a rotor rotation rate of 1 r.p.m. by the viscosity measured as above at a rotor rotation rate of 100 r.p.m. at 20° C. In usual, the thixotropic agent is added in an amount of 1 to 12 parts by weight. The viscosity is measured by use of a B type viscometer at a rotor rotation rate of 1 r.p.m. at a temperature of 20° C. In usual, the solvent is added in an amount of 2 to 30 parts by weight.

Next, starting materials used in this invention are explained below in the concrete.

(a) Epoxide compounds

As the epoxide compounds having two or more epoxy groups on the average per molecule, there can be used polyglycidyl ethers or polyglycidyl esters obtained by reacting epichlorohydrin with a polyhydric phenol such as bisphenol A, halogenated bisphenol A, catechol, resorcinol or the like or a polyhydric alcohol such as glycerol or the like in the presence of a basic catalyst; epoxy novolaks obtained by condensing a novolak type phenolic resin with epichlorohydrin; epoxidized polyolefins, epoxidized polybutadiene, or epoxidized vegetable oils, obtained by epoxidation by a peroxidation method; and the like. Concretely, there can be used epoxy novolak resins such as DEN 431 and DEN 438 manufactured by Dow Chemical Co., Ltd. and Epikote 152 and Epikote 154 manufactured by Shell Chemical Co., Ltd., bisphenol series epoxy resins such as Epikote 828 and Epikote 1001 of Shell Chemical Co., Ltd., etc. The above-mentioned epoxide compounds can be used alone or as a mixture thereof.

(b) Guanidine compounds

There can be used those represented by the following general formulas:

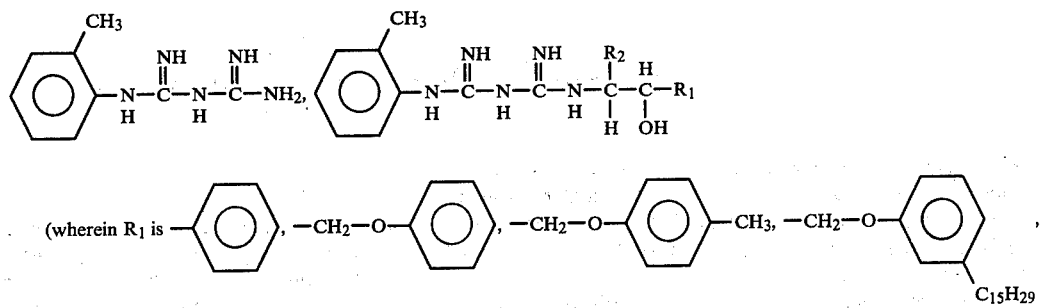

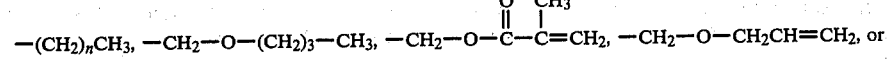

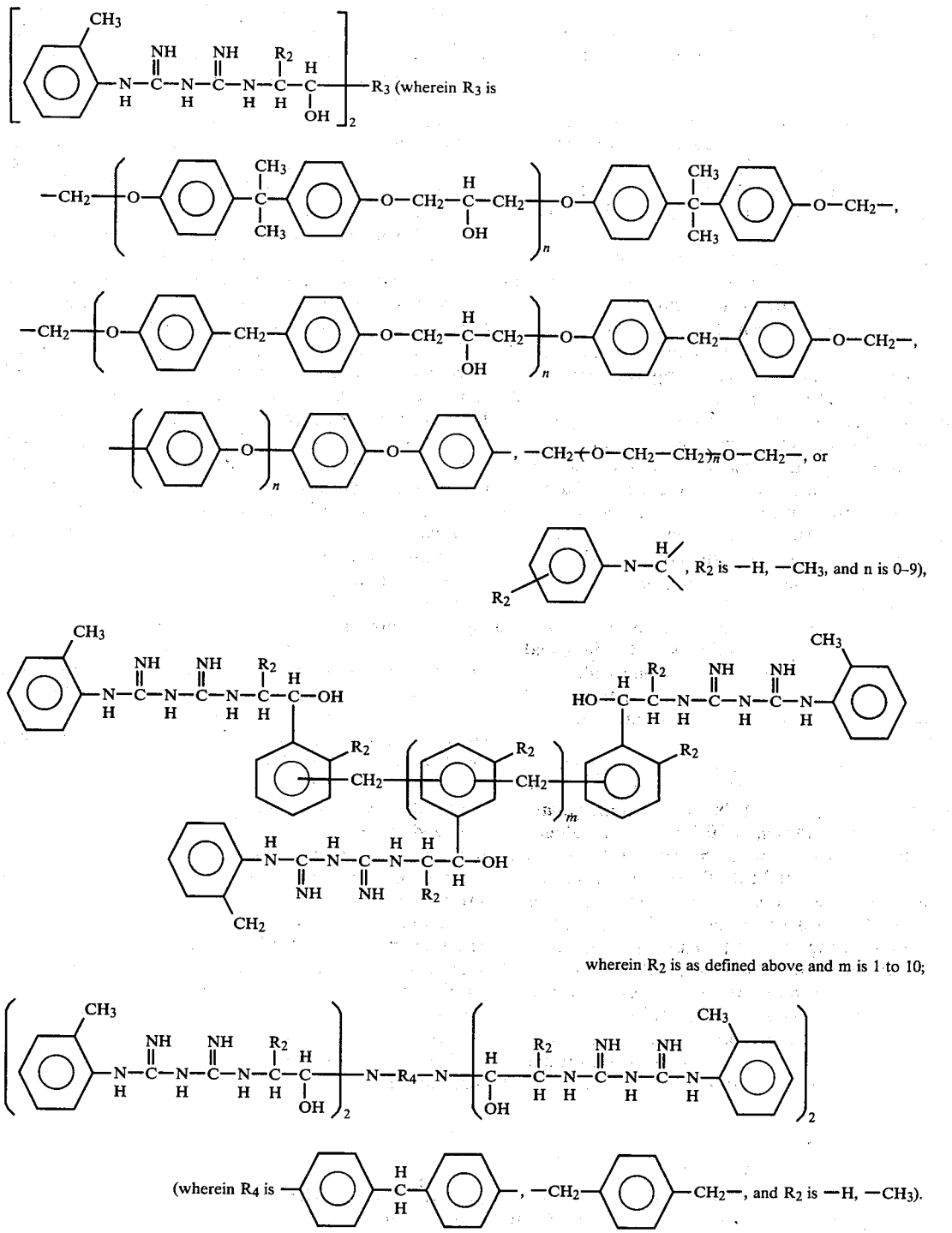

wherein $R_2$ is as defined above and m is 1 to 10;

(wherein $R_4$ is ..., $-CH_2-\langle\bigcirc\rangle-CH_2-$, and $R_2$ is $-H$, $-CH_3$).

When cured with a guanidine compound, an epoxide compound is greatly improved in chemical resistance (e.g., resistance to a chemical plating solution), heat resistance and adhesion (e.g., adhesion to a substrate for a wiring board and a conductor).

Epoxy-modified guanidine compounds obtained by modifying 1-o-tolylbiguanide described above with a monoepoxide compound, a diepoxide compound or a polyfunctional epoxide compound are more preferable, since they are liquid or soluble in organic solvents and hence easy to handle, and they do not cause bleeding at all at the time of heating and curing a printed pattern because they have no highly reactive $-NH_2$ group in the molecule, so that the resulting resist composition has a long availability time (or pot life).

As to the preparation of the epoxy-modified guanidine compounds, to take the case of 1-o-tolylbiguanide, this compound and an epoxide compound of above (a) are dissolved in n-butyl Cellosolve and heated at 80° C. for 90 minutes or more with stirring to complete the chemical reaction shown below, whereby epoxy-modified 1-o-tolylguanide is obtained. The epoxy-modified guanidine compounds can be used alone or as a mixture thereof.

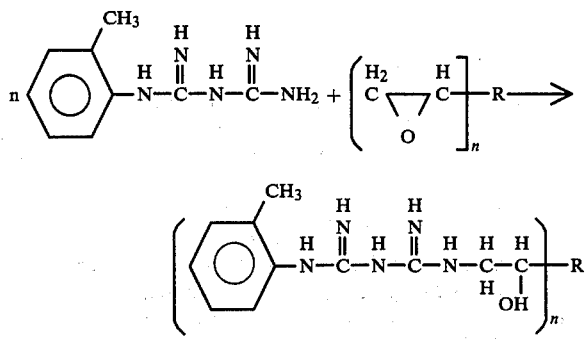

The above-mentioned 1-o-tolylbiguanide or epoxy-modified guanidine compounds may be used in combination with one or more members selected from the group consisting of aliphatic amines, aromatic amines, modified aromatic amines, imidazole compounds and dicyandiamide.

Concrete examples of the aliphatic amines, the aromatic amines, the modified aromatic amines and the imidazole compounds are shown below below in (i) to (iii).

(i) Aliphatic amines

Ethylenediamine, hexamethylenediamine, diethylenetriamine, triethylenetetramine, tetraethylenepentamine, tripropylenetetramine, dihexamethylenetriamine, trimethylhexamethylene, methaxylenediamine, dimethylaminopropylamine, diethylaminopropylamine, 1-amino-3-aminoethyl-3,5,5-trimethylcyclohexane, diethylaminopropylamine, N-hydroxyethyldiethylenetriamine, and N,N,N', N'-tetramethyl-1,3-butanediamine.

(ii) Aromatic amines and modified aromatic amines

Methaphenylenediamine, 4,4'-diaminodiphenylmethane, 4,4'-diaminodiphenylsulfone, 4,4'-diaminodiphenylimine, biphenylenediamine, 2,4,6-tris(dimethylaminophenol), benzyldimethylamine and hydroxyethylation products thereof, adducts thereof with glycidyl ether, etc.

(iii) Imidazole compounds

Imidazole, 1-methylimidazole, 2-methylimidazole, 1,2-dimethylimidazole, 2-ethylimidazole, 2-ethyl-4-methylimidazole, 2-undecaneimidazole, 2-heptadecaneimidazole, 1-benzyl-2-methylimidazole, 1-vinyl-2-methylimidazole, benzoimidazole, 1-(2-carbamylethyl)-imidazole, 1-(2-carbamyl)-2-ethyl-4-methylimidazole, 2-allyl-2-ethyl-4-methylimidazole, 1-cyanoethyl-2-phenyl-4,5-di(cyanoethoxymethyl)-imidazole, 2-phenyl-4-methyl-5-hydroxymethylimidazole, 2-phenyl-4,5-dihydroxymethylimidazole, adduct of 2-methylimidazole with isocyanuric acid, adduct of 2-phenylimidazole with isocyanuric acid, 1-cyanoethyl-2-methylimidazole, 1-cyanoethyl-2-methylimidazole, 1-cyanoethyl-2-ethyl-4-methylimidazole, 1-azineethyl-2-ethyl-4-methylimidazole, adduct of 2-methyl-4-ethylimidazole with trimesic acid, etc.

The above-mentioned amine compounds can be added in an amount of at most one equivalent per equivalent of the epoxide compound, and the imidazole compounds can be added in an amount of at most 20 parts by weight per 100 parts by weight of the epoxide compound.

(c) Filler

The filler includes inorganic fine powders of talc, mica, alumina, barium sulfate, $SiO_2$, $TiO_2$ and the like. Such fine powders can preferably be added in an amount of 3 to 150 parts by weight per 100 parts by weight of the aforesaid epoxide compound. When they are added in an amount of less than 3 parts by weight or more than 150 parts by weight, the resulting composition is poor in screen printability and film-forming ability. The average particle size of the filler is preferably 10 $\mu$m or less. The filler performs the function of further improving the effect of the guanidine compound of improving the adhesion and the resistance to a plating solution.

The above-mentioned inorganic fine powders can be used alone or as a mixture thereof.

(d) Thixotropic agent

This agent is used for improving the printability of a resist ink. In usual, inorganic ultrafine powder of $SiO_2$ or the like having a particle size of 0.1 $\mu$m or less is properly added.

(e) Organic solvent

Preferable are those which can dissolve epoxide compounds, 1-o-tolylbiguanide, epoxy-modified guanide compounds and curing agents for epoxide compounds other than 1-o-tolylbiguanide and epoxy-modified guanide compounds, and, in consideration of the general properties of resist ink, which are low in volatility, do not remain in a resist film after heating and curing, and have a boiling point of 100° C. or higher and 260° C. or lower. Such organic solvents include, for example, 2-butanol, 1-butanol, 4-methyl-2-pentanol, cyclohexanol, n-propyl acetate, n-butyl acetate, i-butyl acetate, sec-butyl acetate, amyl acetate (pentyl acetate), ethyl lactate, butyl lactate, ethylene glycol monomethyl ether, ethylene glycol monoethyl ether, ethylene glycol monobutylether, diethylene glycol monomethyl ether, diethylene glycol monoethyl ether, diethylene glycol monobutyl ether, diethylene glycol monoacetate, methyl n-propyl ketone, methyl n-butyl ketone, methyl isobutyl ketone, diisobutyl ketone, cyclohexanone, isophorone, diacetone alcohol, nitromethane, nitroethane, etc.

In addition to them, there are the following agents as constituents which may be added if necessary.

(f) Coloring agent

When coloring is desired, pigments such as Phthalocyanine Blue, PHthalocyanine Green and the like can be used.

(g) Defoaming agent

This agent is effective for removing bubbles entangled at the time of printing, and silicone oil and the like may be used.

The resist composition for electroless metal plating can be produced by kneading the abovementioned components together by means of, for example, a mixing and grinding machine and further kneading the resulting mixture sufficiently by means of a three-roll mill.

The epoxy resin composition can be cured at high temperatures, e.g. 100° to 150° C., more preferably at 120° to 135° C.

This invention is explained below referring to Examples.

EXAMPLES 1 AND 2

An epoxide compound, 1-o-tolylbiguanide, one or two curing agents, a filler, an organic solvent, a thixotropic agent, a defoaming agent and a coloring agent were mixed according to each of the recipes of samples No. 1 and No. 2 in the Table, kneaded together by means of a mixing and grinding machine and sufficiently kneaded by means of a three-roll mill to obtain a resist composition for electroless copper plating. The thixotropy indexes and viscosities of the thus obtained resist compositions were 25 and 4,160 poises, and 23 and 3,519 poises, respectively as shown in the sample No. 1 and No. 2 columns in the Table.

A copper-clad glass-epoxy laminate was used as substrate. A commercially available conventional resist was coated on the surface portions of the substrate other than conductor forming portions by a screen printing method and dried to form a resist layer. Subsequently, the exposed copper portions of the substrate were removed by etching, followed by washing with water. The resist layer was removed from the substrate by dissolving it in a solvent to form a conductor pattern having a conductor width of 0.3 to 20 mm with a spacing of 0.7 to 5 mm. Then, the resist composition (No. 1 or No. 2) was screen printed on the substrate having the conductor pattern so as not to cover end portions of the conductors and dried. After heating at 130° C. for 30 minutes, there was obtained a resist layer having a uniform thickness between 10 and 25 μm.

Next, the resulting substrate was immersed in the chemical copper plating solution shown below for 20 hours.

| | |
|---|---|
| CuSO$_4$ | 13 g/liter |
| Disodium ethylenediaminetetraacetate | 40 g/liter |
| NaOH | 11.5 g/liter |
| Polyethylene glycol stearylamine | 0.1 g/liter |
| α,α'-Dipyridyl | 5 mg/liter |
| Formalin (37%) | 3 mg/liter |
| Water | An amount required to make up the whole to 1 liter |
| Plating temperature | 70° C. |
| pH = 12.2 | |

The plating bath was equipped with a device for automatically controlling the concentration of the solution, and the Cu$^{+2}$ concentration, pH, formalin concentration and ethylenediaminetetraacetic acid concentration in the plating solution were kept constant.

Next, the resulting substrate was taken out of the plating solution, washed with water, and then dried in a heating furnace at 80° C. for 20 minutes.

The individual thus formed resist films showed no abnormality such as color change, for example, to white, swelling, blistering, peeling-off from the base board, and the like.

Each resist film was treated with a sharp nife so as to draw a lattice with a pitch of 1 mm according to a guide for cross-cut adhesion test prescribed by JIS K5400. An adhesive Cellophane tape was sufficiently adhered to the portion on which the lattice was drawn, and then peeled off at a stretch at an angle of 45°, and the peeling-off condition of the resist film subjected to cross-cutting was observed. The coating film was not peeled off at all in the cross-cut adhesion test according to JIS K5400.

The resulting circuit boards were then subjected to flux treatment and then placed in a soldering bath at 260° C. for 20 seconds so that the resist film might be in contact with solder, and their appearances were observed to find that the resist film neither blistered nor cracked. Then the resist films were subjected to the cross-cut adhesion test to find that they were not peeled off at all.

EXAMPLES 3 TO 13

Starting materials were mixed according to each of the recipes of samples Nos. 3 to 13 in the Table, and resist compositions for electroless copper plating were obtained in the same manner as in Example 1.

The epoxy-modified guanide compounds used here were obtained by the following processes. A butylglycidyl-modified guanide compound (A) was obtained by mixing and stirring 191 g of 1-o-tolylbiguanide, 130 g of butyl glycidyl ether and 80 g of ethylene glycol monobutyl ether, and heating the resulting mixture at 80° C. for 1.5 hours.

A phenylglycidyl-modified guanide compound (B) was obtained by mixing and stirring 191 g of 1-o-tolylbiguanide, 150 g of phenyl glycidyl ether and 80 g of ethylene glycol monobutyl ether, and heating the resulting mixture at 80° C. for 1.5 hours.

A bisphenol type epoxy-modified guanide compound (C) was obtained by mixing and stirring 191 g of 1-o-tolylbiguanide, 190 g of Epikote 828 (manufactured by Shell Chemical Co., Ltd.) and 190 g of ethylene glycol monobutyl ether, and heating the resulting mixture at 80° C. for 4 hours.

A novolak type epoxy-modified guanide compound (D) was obtained by mixing and stirring 191 g of 1-o-tolylbiguanide, 175 g of Epikote 152 (manufactured by Shell Chemical Co., Ltd.) and 190 g of ethylene glycol monobutyl ether, and heating the resulting mixture at 80° C. For 4 hours.

A diglycidylaniline-modified guanide compound (E) was obtained by mixing and stirring 191 g of 1-o-tolylbiguanide, 135 g of diglycidylaniline (manufactured by Nippon Kayaku Co., Ltd.) and 80 g of ehtylene glycol monobutyl ether, and heating the resulting mixture at 80° C. for 1.5 hours.

A tetraglycidyl ether-methaxylylenediamine-modified guanide compound (F) was obtained by mixing and stirring 191 g of 1-o-tolylbiguanide, 102 g of tetraglycidyl ether-methaxylylenediamine and 190 g of ethylene glycol monobuytl ether, and heating the resulting mixture at 80° C. for 4 hours.

The amounts of the guanide compounds in the resist compositions were 0.5 to 2.0 equivalents per equivalent of the epoxide compound. The thixotropic indexes and viscosities of the resist compositions are shown in the sample No. 3 to No. 13 columns in the Table. Each of the resist compositions was printed on a substrate having a conductor pattern thereon in the same manner as in Example 1, and the resistance to the plating solution and the heat resistance at the time of soldering of the thus obtained resist films were evaluated. In all the cases, as in Example 1, the resist film underwent no change such as color change, blistering, cracking, peeling-off and the like. All the resist films were not peeled off at all in the cross-cut adhesion test after soldering treatment.

COMPARATIVE EXAMPLES

Starting materials were mixed according to each of the recipes of samples Nos. 14 to 18 in the Table, and resist compositions for electroless copper plating solutions were obtained in the same manner as in Example 1. In these resist compositions, the amounts of the guanidine compounds were outside the range of 0.5 to 2.0 equivalents per equivalent of the epoxide compound, or no guanidine compound was used as a curing agent.

Each of the aforesaid resist compositions was printed on a substrate having a conductor pattern thereon in the same manner as in Example 1, and the resistant to the plating solution and the heat resistant at the time of soldering of the thus obtained resist films were evaluated. After subjected to electroless copper plating, each conductor pattern (a copper foil) under each of the resist films was changed in color so as to have dark brown spots. After subjected to soldering, portions of the resist film corresponding to the discolored portions were blistered. When the resist films were subjected to the cross-cut adhesion test according to JIS K5400 after electroless plating, 35 to 50% of each area of all the resist films was peeled off.

TABLE 1

| Specification | | Sample No. | | | | | | | | |
|---|---|---|---|---|---|---|---|---|---|---|
| | | 1 | 2 | 3 | 4 | 5 | 6 | 7 | 8 | 9 |
| Epoxide compound | Epikote 152 (mfd. by Shell Chemical Co., Ltd. novolak type epoxy, epoxy equiv. 175) | 100 | 100 | 50 | 50 | 100 | 100 | 100 | 100 | 100 |
| | Epikote 154 (mfd. by Shell Chemical Co., Ltd., novolak type epoxy, epoxy equiv. 197) | — | — | 50 | 50 | — | — | — | — | — |
| | Epikote 1001 (mfd. by Shell Chemical Co., Ltd., bisphenol type epoxy, epoxy equiv. 475) | — | — | — | — | — | — | — | — | — |
| | BREN (mfd. by Nihon Kayaku Co., Ltd., novolak type brominated epoxy, epoxy equiv. 275) | — | — | — | — | — | — | — | — | — |
| Curing agent | | | | | | | | | | |
| Guanide compound | Tolylbiguanide | 20 (1.3 equiv.) | 10 (0.64 equiv.) | — | — | — | — | — | — | — |
| Epoxy-modified guanide compound | Buthylglycidyl-modified guanide compound (A) | — | — | 44.8 (1.0 equiv.) | — | 22.4 (0.5 equiv.) | — | — | — | — |
| | Phenylglycidyl-modified guanide compound (B) | — | — | — | 46.9 (1.0 equiv.) | — | — | — | — | — |
| | Bisphenol type epoxy-modified guanide compound (C) | — | — | — | — | — | 32.8 (0.5 equiv.) | 65.5 (1.0 equiv.) | 98.2 (1.5 equiv.) | 131 (2.0 equiv.) |
| | Novolak type epoxy-modified guanide compound (D) | — | — | — | — | — | — | — | — | — |
| | Diglycidylaniline-modified guanide compound (E) | — | — | — | — | — | — | — | — | — |
| | Tetraglycidyl-methaxylylenediamine modified guanide compound (F) | — | — | — | — | — | — | — | — | — |
| Others | Adeca EH-1013 (mfd. by Asahi Denka Co., Ltd., aromatic amine, active hydrogen equiv. 64) | — | — | — | — | — | — | — | — | — |
| | Methaphenylenediamine (active hydrogen equiv. 28.5) | — | 2.5 | — | — | 4 | — | — | — | — |
| | 2-Ethyl-4-methyl-imidazole | 10 | 10 | — | — | 10 | — | — | — | — |
| Filler | Talc powder (av. particle size 2 μm) | — | — | — | — | — | — | — | — | — |
| | Alumina powder (av. particle size 1 μm) | — | — | 25 | 25 | — | — | — | — | — |
| | Barium sulfate powder (av. particle size 0.8 μm) | — | — | — | — | 10 | — | — | — | — |
| | Silica powder (av. particle size 1 μm) | — | — | — | — | — | — | — | — | — |
| | Quartz glass powder (av. particle size 2.8μ) | — | — | — | — | 12 | 20 | 20 | 20 | 20 |
| Organic solvent | Ethylene glycol monobutyl ether (bp 171° C.) | 15 | 10 | 12 | 12 | 12 | 20 | 18 | 16 | 14 |
| | Diethylene glycol monobutyl ether (bp 230° C.) | 6 | 6 | 3 | 3 | 6 | 5 | 5 | 5 | 5 |
| Thixotropic agent | Aerosil A380(mfd. by Nihon Aerosil Co., Ltd., quartz powder, av. particle size 7 × 10⁻³ μm) | 2 | 2 | 1.5 | 1.5 | 1.5 | 1.5 | 1.5 | 1.5 | 1.5 |
| Defoaming agent | SC-5540 (mfd. by Toray Silicone Co., Ltd., Silicone Oil) | — | — | — | — | — | — | — | — | — |
| Coloring agent | Phthalocyanine Green | 1.5 | 1.5 | 1.5 | 1.5 | 1.5 | 1.5 | 1.5 | 1.5 | 1.5 |
| Thixotropy index | | 25 | 23 | 28 | 25 | 32 | 28 | 23 | 18 | 15 |
| Viscosity (poise at 20° C.) η₁/η₁₀₀ | | 4160/166 | 3519/153 | 2810/100 | 3130/125 | 4200/125 | 3400/121 | 3040/132 | 2810/156 | 2700/180 |

| Specification | | Sample No. | | | | | | | | |
|---|---|---|---|---|---|---|---|---|---|---|
| | | 10 | 11 | 12 | 13 | 14 | 15 | 16 | 17 | 18 |
| Epoxide compound | Epikote 152 (mfd. by Shell Chemical Co., Ltd., novolak type epoxy, epoxy equiv. 175) | 60 | — | — | — | 100 | 100 | 100 | — | 100 |
| | Epikote 154 (mfd. by Shell Chemical Co., Ltd., novolak type epoxy, epoxy equiv. 197) | 40 | 100 | — | — | — | — | — | 100 | — |
| | Epokite 1001 (mfd. by Shell Chemical Co., Ltd., bisphenol type epoxy, epoxy equiv. 475) | — | — | 100 | — | — | — | — | — | — |

TABLE 1-continued

| | | | | | | | | | |
|---|---|---|---|---|---|---|---|---|---|
| Curing agent | | | | | | | | | |
| Guanide compound | BREN (mfd. by Nihon Kayaku Co., Ltd., novolak type brominated epoxy, epoxy equiv. 275) | — | — | — | 100 | — | — | — | — | — |
| | 1-O—Tolylbiguanide | — | — | — | — | — | — | — | — | — |
| Epoxy-modified guanide compound | Butylglycidyl-modified guanide compound (A) | 38.3 (0.7 equiv.) | — | — | — | — | — | — | — | — |
| | Phenylglycidyl-modified guanide compound (B) | — | 44.1 (1.0 equiv.) | 8.5 (0.5 equiv.) | — | — | — | — | — | — |
| | Bisphenol type epoxy-modified guanide compound (C) | — | — | — | — | 26.2 (0.4 equiv.) | 164 (2.5 equiv.) | — | — | — |
| | Novolak type epoxy-modified guanide compound (D) | — | — | — | — | — | — | — | — | — |
| | Diglycidylaniline-modified guanide compound (E) | — | — | — | — | — | — | — | — | — |
| | Tetraglycidyl-methaxylylene modified guanide compound (F) | — | — | — | 21.2 (0.6 equiv.) | — | — | — | — | — |
| Others | Adeca EH-1013 (mfd. by Asahi Denka Co., Ltd., aromatic amine, active hydrogen equiv. 64) | — | — | — | 5.4 (0.4 equiv.) | — | 33 | — | — | — |
| | Methaphenylenediamine (active hydrogen equiv. 28.5) | — | — | — | — | — | — | 14.7 | — | — |
| | 2-Ethyl-4-methyl-imidazole | — | — | 2.0 | — | — | — | — | — | 8 |
| Filler | Talc powder (av. particle size 2 μm) | — | — | — | — | — | 10 | 15 | — | — |
| | Alumina powder (av. particle size 1 μm) | 20 | — | — | — | — | — | — | — | — |
| | Barium sulfate powder (av. particle size 0.8 μm) | — | — | — | — | — | — | — | — | 35 |
| | Silica powder (av. particle size 1 μm) | — | 15 | 20 | 20 | 20 | — | — | — | — |
| | Quartz glass powder (av. particle size 2.8 μm) | — | — | — | — | — | 20 | — | — | — |
| Organic solvent | Ethylene glycol monobutyl ether (bp 171° C.) | 17 | 17 | 18 | 16 | 21 | 13 | 16 | 12 | 6 |
| | Diethylene glycol monobutyl ether (bp 230° C.) | — | — | — | — | — | — | 4 | 6 | 6 |
| Thixotropic agent | Aerosil A380 (mfd. by Nihon Aerosil Co., Ltd., quartz powder, av. particle size 7 × 10⁻³ μm) | 4 | 3 | 5 | 5 | 5 | 5 | — | — | — |
| Defoaming agent | SC-5540 (mfd. by Toray Silicone Co., Ltd., Silicone Oil) | 2 | 1 | — | — | — | — | 2 | 2 | 2 |
| Coloring agent | Phthalocyanine Green | 1.5 | 1.5 | 1.5 | 1.5 | 1.5 | 1.5 | 1.5 | 1.5 | 1.5 |
| Thixotropy index | | 20 | 25 | 28 | 29 | 30 | 12 | 14 | 18 | 25 |
| Viscosity (poise at 20° C.) $\eta_1/\eta_{100}$ | | 3760/188 | 4210/168 | 2080/74 | 2100/72 | 3520/117 | 3420/285 | 2940/210 | 2700/150 | 4800/112 |

(Note) Curing conditions: temperature 130° C., time 30 min.

What is claimed is:

1. An epoxy resin composition comprising:
   (a) one or more epoxide compounds having two or more epoxy groups on the average per molecule in an amount of 100 parts by weight.
   (b) one or more epoxy-modified guanidine compounds obtained by modifying 1-o-tolylbiguanide with a monoepoxide compound, a diepoxide compound or a polyfunctional epoxide compound in an amount of 0.05 to 2.0 equivalents per equivalent of the epoxide compound,
   (c) one or more fillers in an amount of 3 to 150 parts by weight;
   (d) a thixotropic agent consisting essentially of powder of $SiO_2$ having a particle size of 0.1 $\mu$m or less, and
   (e) an organic solvent; said thixotropic agent being used in an amount for making the thixotropy index of said composition 5 to 40, and said organic solvent being used in an amount for making the viscosity of said composition 800 to 10,000 poises when measured by a B type rotational viscometer at a rotational rate of 1 rpm at 20° C.

2. An epoxy resin composition according to claim 1, wherein the guanidine compound is one represented by the general formula:

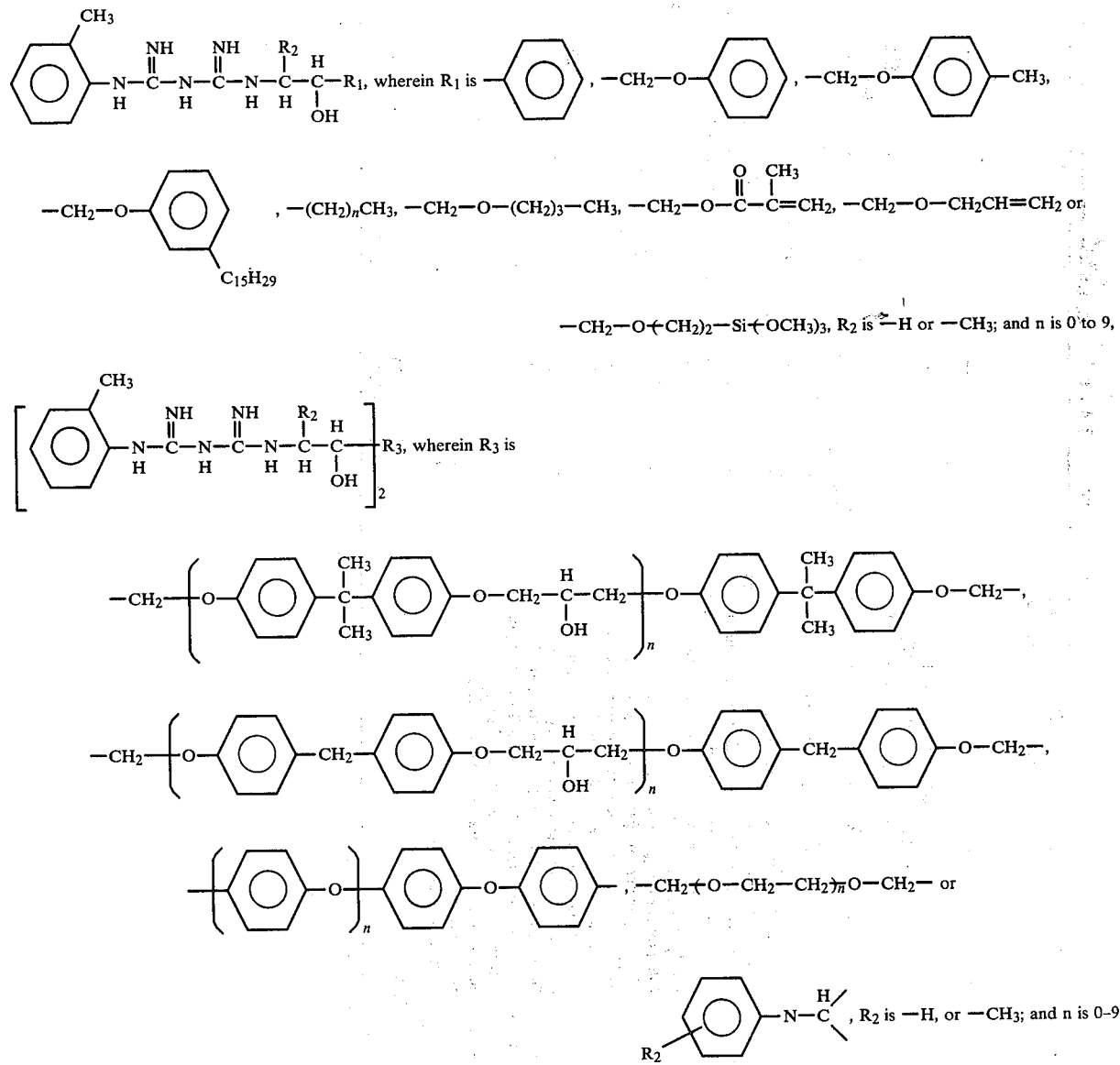

-continued

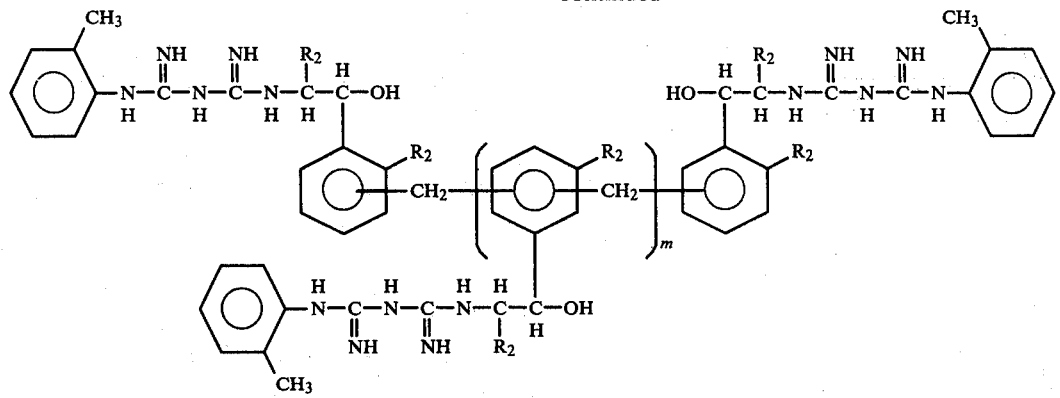

wherein $R_2$ is —H, —$CH_3$, and m = 1–10; or

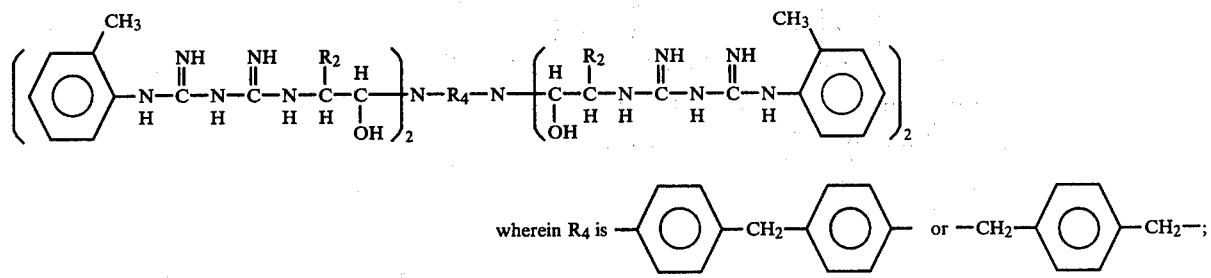

wherein $R_4$ is and $R_2$ is —H or —$CH_3$.

3. An epoxy resin composition according to claim 1, wherein the epoxide compound having on the average two or more epoxy groups per molecule is at least one compound selected from polyglycidyl ethers, polyglycidyl esters, epoxynovolaks, epoxydated polyolefines, epoxidated polybutadiene, dicyclopentadiene modified oxides, and epoxidated vegetable oils.

4. An epoxy resin composition according to claim 1, wherein the epoxy-modified guanidine compound is an addition reaction product of 1-o-tolylbiguanide with a monoepoxide compound, an addition reaction product of 1-o-tolylbiguanide with a diepoxide compound, or an addition reaction product of 1-o-tolylbiguanide with a polyfunctional epoxide compound.

5. An epoxy resin composition according to claim 1, wherein the filler is particles having an average particle size of 10 μm or less selected from talc, mica, alumina, barium sulfate, silica and $TiO_2$.

6. An epoxy resin composition according to claim 1, wherein the organic solvent has a boiling point of 100° C. or higher and 260° C. or lower.

7. An epoxy resin composition according to claim 1, which further comprises a defoaming agent and/or a coloring agent.

8. An epoxy resin composition according to claim 7, wherein the defoaming agent is silicone oil and the coloring agent is phthalocyanine green or phthalocyanine blue.

9. An epoxy resin composition according to claim 1, which further comprises at least one curing agent selected from the group consisting of amine compounds and imidazole compounds, a defoaming agent and a coloring agent.

10. An epoxy resin composition according to claim 1, wherein the epoxy-modified guanidine compound is one represented by the formula:

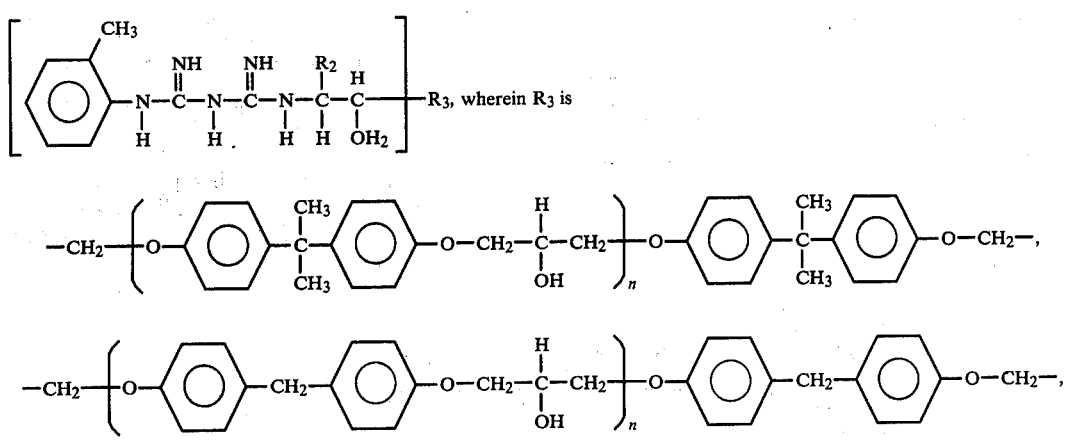

-continued

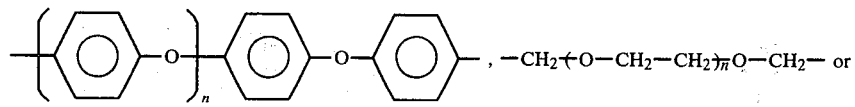

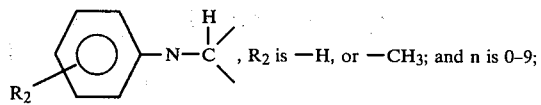, $R_2$ is —H, or —CH$_3$; and n is 0–9;

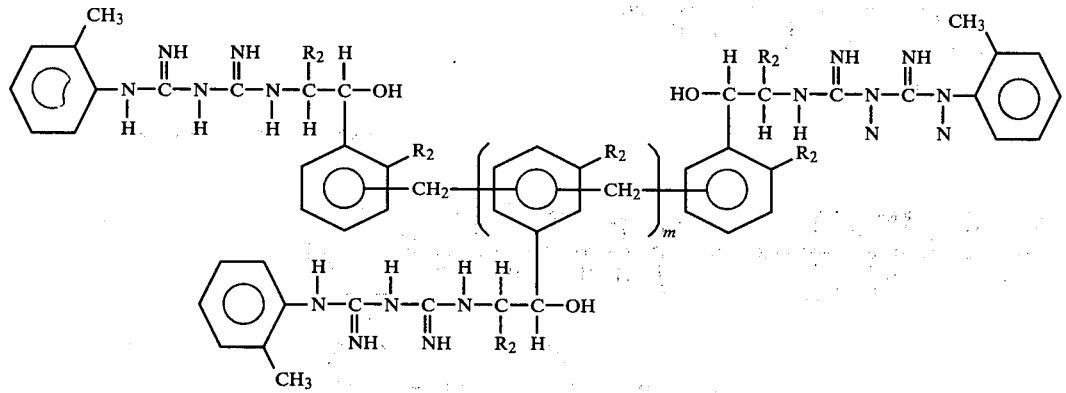

wherein $R_2$ is —H, —CH$_3$ and m = 1–10; or

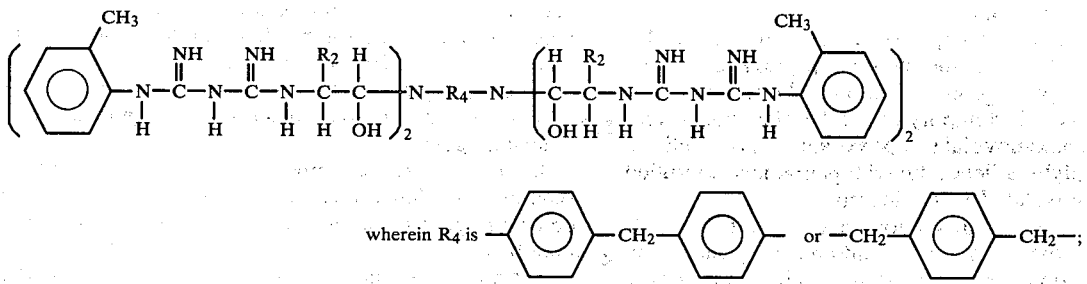

and $R_2$ is —H or —CH$_3$.

11. An epoxy resin composition according to claim 1, wherein the epoxy-modified guanidine compound is one represented by the formula:

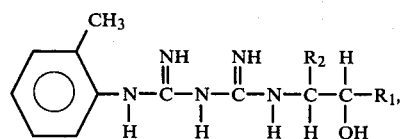

wherein $R_1$ is

-continued

—CH$_2$—O—⟨phenyl⟩—CH$_3$, —CH$_2$—O—⟨phenyl-$C_{15}H_{29}$⟩,

—(CH$_2$)$_n$CH$_3$, —CH$_2$—O—(CH$_2$)$_3$—CH$_3$, $$-CH_2-O-\overset{O}{\underset{}{C}}-\overset{CH_3}{\underset{}{C}}=CH_2,$$ —CH$_2$—O—CH$_2$CH=CH$_2$ or —CH$_2$—O—(CH$_2$)$_2$—Si—(OCH$_3$)$_3$, $R_2$ is —H or —CH$_3$; and n is 0 to 9.

12. An epoxy resin composition according to claim 1, wherein the epoxy-modified guanidine compound is one represented by the following formula:

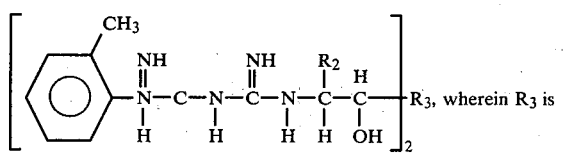, wherein $R_3$ is

-continued

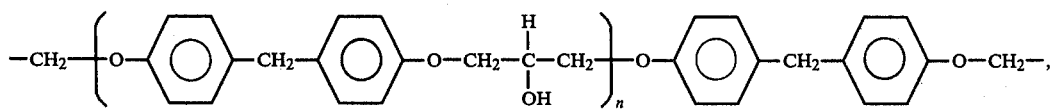

and n is 0–9.

13. An epoxy resin composition resin according to claim 1, which further comprises at least one curing agent selected from the group consisting of an amine compound and an imidazole compound, said amine being added in an amount of at most 1 equivalent per equivalent of the epoxy compound, and the imidazole compound being added in an amount of at most 20 parts by weight per 100 parts by weight of the epoxy compound.

14. An epoxy resin composition according to claim 1, wherein said organic solvent is selected from the group consisting of 2-butanol, 1-butanol, 4-methyl-2-pentanol, cyclohexanol, n-propyl acetate, n-butyl acetate, i-butyl acetate, sec-butyl acetate, amyl acetate (pentyl acetate), ethyl lactate, butyl lactate, ethylene glycol monomethyl ether, ethylene glycol monoethyl ether, ethylene glycol monobutylether, diethylene glycol monomethyl ether, diethylene glycol monoethyl ether, diethylene glycol monobutyl ether, diethylene glycol monoacetate, methyl n-propyl ketone, methyl n-butyl ketone, methyl isobutyl ketone, diisobutyl ketone, cyclohexanone, isophorone, diacetone alcohol, nitromethane, and nitroethane.

* * * * *